United States Patent
Guan et al.

[11] Patent Number: 6,106,626
[45] Date of Patent: Aug. 22, 2000

[54] APPARATUS AND METHOD FOR PREVENTING CHAMBER CONTAMINATION

[75] Inventors: Kun-lin Guan, Pu-tzu; Wei-jen Liu, Hsin-Chu; Jin-lang Wu, Chu-pei, all of Taiwan

[73] Assignee: Taiwan Semincondutor Manufacturing Company, Ltd, Hsin Chu, Taiwan

[21] Appl. No.: 09/204,525

[22] Filed: Dec. 3, 1998

[51] Int. Cl.[7] .................................................. C23C 16/00
[52] U.S. Cl. .............................. 118/715; 156/345; 55/312
[58] Field of Search ..................... 55/312–314; 95/132; 96/422, 252, 114; 118/715, 716, 733, 723 E, 506; 156/345

[56] References Cited

U.S. PATENT DOCUMENTS

| | | | |
|---|---|---|---|
| 4,906,257 | 3/1990 | Fukunaga et al. | 55/312 |
| 4,910,042 | 3/1990 | Hokynar | 118/715 |
| 5,888,579 | 3/1999 | Lun | 427/8 |

*Primary Examiner*—Timothy Meeks
*Assistant Examiner*—Parviz Hassanzadeh
*Attorney, Agent, or Firm*—Tung & Associates

[57] ABSTRACT

An apparatus and a method for preventing contamination to a low pressure chemical vapor deposition chamber (LPCVD) are provided. The apparatus includes an exhaust-vent device which is connected to a vent outlet and a vacuum pump on a process chamber in parallel with and bypassing a gate valve such that the exhaust-vent remains open during a continuous pumping of the process chamber for wafer loading and unloading. The exhaust-vent device is constructed by two end conduits that have a larger diameter connected by a middle conduit that has a smaller diameter such that during vacuum evacuation, the fluid flow rate in the smaller diameter conduit is at least four times that in the large conduit to effectively prevent the deposition in the small conduit of reaction by-products. The present invention apparatus may further be enhanced by mounting heating tapes on the vacuum conduits and heating the conduits to a temperature of between about 100° C. and about 180° C. to further prevent the deposition of contaminating particles on the interior walls of the conduits.

20 Claims, 2 Drawing Sheets

APPARATUS AND METHOD FOR PREVENTING CHAMBER CONTAMINATION

FIELD OF THE INVENTION

The present invention generally relates to an apparatus and a method for semiconductor processing and more particularly, relates to an apparatus and a method for preventing contamination in a semiconductor process chamber by installing an exhaust-vent device to the chamber such that the chamber may be continuously pumped during a wafer loading and unloading step, the device is further equipped with a reduced cross-sectional area for achieving increased fluid flow therethrough for preventing blockage of the device.

BACKGROUND OF THE INVENTION

In semiconductor processing, a large portion of the yield losses can be attributed to contaminations by particles and films of various nature. The contaminants may be organic or inorganic particles, films formed of polymeric bases, or other ionic based materials. The particles or films may be generated as byproducts in the reaction of reactant gases, by the surrounding environment, by the processing equipment or by the handling of manufacturing personnel. Some contaminants are particles or films generated from condensed organic vapors, solvent residues, photoresist or metal oxide compounds.

Typical problems and the detrimental effects caused by particle or film contaminants are poor adhesion of deposited layers, poor-formation of LOCOS oxides, or poor etching of the underlying material. The electrical properties and the stability of devices built on the semiconductor substrate may also be seriously affected by ionic based contaminants. The various forms of contaminants therefore not only reduce the product yield but also degrades the reliability of the devices built. For instance, contaminant particles can cause a device to fail by improperly defined patterns, by creating unpredictable surface topography, by inducing leakage current through insulating layer, or otherwise reducing the device lifetime. It is generally recognized that a particle contaminant that exceeds one-fifth to one-half of a minimum feature size on a device has the potential of causing a fatal defect, i.e. a defect that causes a device to fail completely. A defect of smaller size may also be fatal if it falls in a critical area, for instance, a particle contaminant in the gate oxide layer of a transistor. In modern high density devices, such as a dynamic random access memory chip, the maximum allowable number of particle contaminants per unit area of the device must be reduced accordingly in order to maintain an acceptable yield and reliability.

One of the widely used processing techniques for semiconductor wafers is a low pressure chemical vapor deposition (LPCVD) technique can be carried out in an apparatus such as that shown in FIG. 1. The LPCVD method has been widely used in the deposition of silicon nitride or TEOS oxide films on semiconductor wafers. In the method, a gas containing the structural elements of the film material to be formed is first fed into a chamber, followed by heating the gas mixture to induce a chemical reaction to deposit the desired film on the semiconductor substrate. In a conventional CVD method, a silicon nitride film can be deposited by a chemical reaction between silane ($SiH_4$) and ammonia ($NH_3$) at 1 ATM and a temperature of 700~900° C., or by a mixture of dichlorosilane ($SiCl_2H_2$) and ammonia at a reduced pressure and a temperature of 700~800° C.

As shown in FIG. 1, reactant gases of dichlorosilane 12 and ammonia 14, each carried by a carrier gas of nitrogen, are fed into the process chamber 18 through the inner tubes 40. The reaction gases are mixed at the bottom portion of inner tubes 40. Manifold 16 provides inlets and outlets for the gases and is used as a pedestal support for the inner tubes 40 and the outer tubes 24. The process chamber 18 is first evacuated by vacuum pump not shown prior to the reaction. A purge gas of nitrogen 22 is then used to fill the process chamber 18 and to drive out any residual gas left from the previous deposition cycle. A cold trap 26 maintained at sub-ambient temperature, e.g., at approximately 12~18° C., is used in the vacuum line to trap particles that cannot be pumped away. The manifold 16 is provided with a pressure sensor 28 which is connected via a conduit 30 to the manifold 16 at a pressure port 32. A main valve 34 and pressure switches 20 are provided in the vacuum evacuation line for controlling the fluid flow. A vent line 48 is connected to the vacuum evacuation line for venting spent reactant gases through control valves 52 and 54 to the exhaust vent 56.

After the reactant gases of $SiCl_2H_2$ and $NH_3$ are mixed in the inner tube 40, the gas mixture is flown into the process chamber 18 to deposit silicon nitride films on wafers held in a wafer boat (not shown). It has been observed that during the reaction between $SiCl_2H_2$ and $NH_3$, a reaction byproduct of $NH_4Cl$ is frequently produced. The ammonium chloride powder which is in a very fine powdery form causes a defect on the wafer surface known as nitride haze. It is believed that during a niride deposition process, contaminating powder may be coated inside the conduit between the chamber 18 and the cold trap 26, inside the conduit between the cold trap 26 and the gate valve 34, inside the gate valve 34, and inside the conduit between the gate valve 34 and the automatic pressure controller 20. The powdery contaminant may then be siphoned back into the process chamber 18 during an unintentional back-flow process. The fine powder of ammonium chloride deposits on top of a wafer surface and forms a haze defect. The nitride haze, once formed, is very difficult to remove from the wafer surface. For instance, a wet scrubbing method by using a brush cannot remove the haze from the wafer surface. The nitride haze acts as an additional insulating layer on top of the silicon wafer and presents processing difficulties in subsequently carried out processes. One of such processing difficulties occurs in the formation of LOCOS oxide insulation. The nitride haze impedes the growth of LOCOS oxide. Similar contaminants have also been observed in a TEOS oxide deposition process with similarly undesirable results.

It is therefore an object of the present invention to provide an apparatus for preventing contamination to a process chamber that does not have the drawbacks or shortcomings of a conventional apparatus.

It is another object of the present invention to provide an apparatus for preventing contamination to a process chamber used in a low pressure chemical vapor deposition process that includes an exhaust-vent device for venting the chamber during wafer loading and unloading steps.

It is a further object of the present invention to provide an apparatus for preventing contamination to a low pressure chemical vapor deposition chamber which includes an exhaust-vent device connected parallelly with a gate valve such that the process chamber may be continuously evacuated during wafer loading and unloading steps.

It is another further object of the present invention to provide an apparatus for preventing particle contamination to a low pressure chemical vapor deposition chamber by using an exhaust-vent device connected parallelly with a gate valve for providing continuous evacuation of the chamber wherein the device is equipped with a reduced cross-sectional area for increased fluid flow and reduced probability of particle depositions.

It is still another object of the present invention to provide an apparatus for preventing contamination in a low pressure chemical vapor deposition chamber by utilizing an exhaust-vent device connected for bypassing a gate valve which has a section of reduced cross-sectional area of less than one half of the remaining sections.

It is yet another object of the present invention to provide a method for preventing contamination to a low pressure chemical vapor deposition chamber by connecting an exhaust-vent device to bypass a gate valve and then turning on the device during loading and unloading of wafers from the chamber.

It is yet another further object of the present invention to provide a method for preventing contamination to a low pressure chemical vapor deposition chamber by using an exhaust-vent device equipped with a first and second conduit each having an internal diameter at least two times that of a middle conduit such that a fluid flow rate through the middle conduit is greatly increased for preventing particulate deposition in the middle conduit.

SUMMARY OF THE INVENTION

In accordance with the present invention, an apparatus and a method for preventing contamination to a low pressure chemical vapor deposition chamber are provided.

In a preferred embodiment, an apparatus for preventing contamination to a low pressure chemical vapor deposition chamber can be provided which includes a chamber equipped with a vent outlet in fluid communication with a gate valve and an evacuation means; and an exhaust-vent device connected to the vent outlet and the evacuation means in parallel with and bypassing the gate valve, the exhaust-vent device includes a first conduit and a second conduit connected in fluid communication with a middle conduit thereinbetween, the first conduit and the second conduit each has an internal diameter that is at least two times the internal diameter of the middle conduit, the device further includes a pneumatic valve that is positioned in the middle conduit adapted for turning on or off the exhaust-vent device.

The apparatus for preventing contamination to a low pressure chemical vapor deposition chamber may further include a cold trap and an automatic pressure controller connected in series and in fluid communication with the gate valve. The pneumatic valve may be turned on during wafer loading and unloading steps into and out of the deposition chamber with the evacuation means in operation. The evacuation means may be a vacuum pump. The first conduit and the second conduit each has an internal diameter four times the internal diameter of the middle conduit. The pneumatic valve may be a normal-closed air actuated valve.

The exhaust-vent device may include a first conduit and a second conduit which have an internal diameter of about 25.4 mm and a middle conduit which has an internal diameter of about 6.35 mm. The low pressure chemical vapor deposition chamber may be a silicon nitride deposition chamber. The exhaust-vent device may be turned on during wafer loading and unloading such that reaction by-products produced in the deposition chamber can be carried away by the evacuation means. The deposition chamber may also be a silicon nitride deposition chamber which generates a reaction by-product of $NH_4Cl$ fine powder. The deposition chamber may also be a TEOS deposition chamber.

A fluid flow rate in the middle conduit of the device when the evacuation means is operating may be at least four times the fluid flow rate in the first and second conduit. A fluid flow rate in the middle conduit may also be sufficiently higher than a fluid flow rate in the first and second conduit such that reaction by-product from the chamber does not cumulate in the middle conduit. The fluid flow rate in the middle conduit may be sufficiently high such that reaction by-product from the deposition chamber does not cumulate in the pneumatic valve. The exhaust-vent device operates to prevent any reaction by-product deposited in the first, second and the middle conduit from being back-flowed into the deposition chamber.

The present invention is further directed to a method for preventing contamination to a low pressure chemical vapor deposition chamber which can be carried out by the operating steps of first providing a chamber that is equipped with a vent outlet in fluid communication with a gate valve and an evacuation means; then connecting an exhaust-vent device in parallel with and bypassing the gate valve with a first conduit of the device connected to the vent outlet, a second conduit of the device connected to the evacuation means and a middle conduit providing fluid communication between the first and second conduit that is equipped with a pneumatic valve; turning on the pneumatic valve with the evacuation means operating and loading at least one wafer into the deposition chamber; conducting a deposition process on the at least one wafer; and then unloading the at least one wafer from the deposition chamber with the pneumatic valve turned on and the evacuation means operating.

The method for preventing contamination may further include the step of providing the exhaust-vent device with a first and second conduit each has an internal diameter at least two times that of the middle conduit. The method may further include the step of providing the evacuation means in a vacuum pump, providing an exhaust-vent device which has a middle conduit smaller than the first and second conduit such that a sufficiently higher fluid flow rate is generated in the middle conduit for preventing cumulation of reaction by-products in the middle conduit. The method may further include the step of conducting a nitride deposition process on the at least one wafer, or conducting a TEOS deposition process on the at least one wafer.

The method may further include the step of providing an exhaust-vent device with a first and second conduit each has an internal diameter four times that of the middle conduit. The method may further include the step of providing the pneumatic valve in a normal-closed air activated valve. The method may further include the step of turning on the exhaust-vent device during wafer loading and unloading to carry away reaction by-products generated in the deposition chamber by a vacuum pump. The method may further include the step of turning on the exhaust-vent device during wafer loading and unloading to carry away ammonium chloride powder generated in a nitride deposition chamber by a vacuum pump. The method for preventing contamination in a LPCVD chamber may further include the step of generating a fluid flow in the middle conduit of the device that is sufficiently high such that reaction by-products from the deposition chamber does not cumulate in the pneumatic valve. The method may further include the step of preventing any reaction by-products deposited in the first, second and middle conduit from being back-flowed into the deposition chamber.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENT

Figure 1:
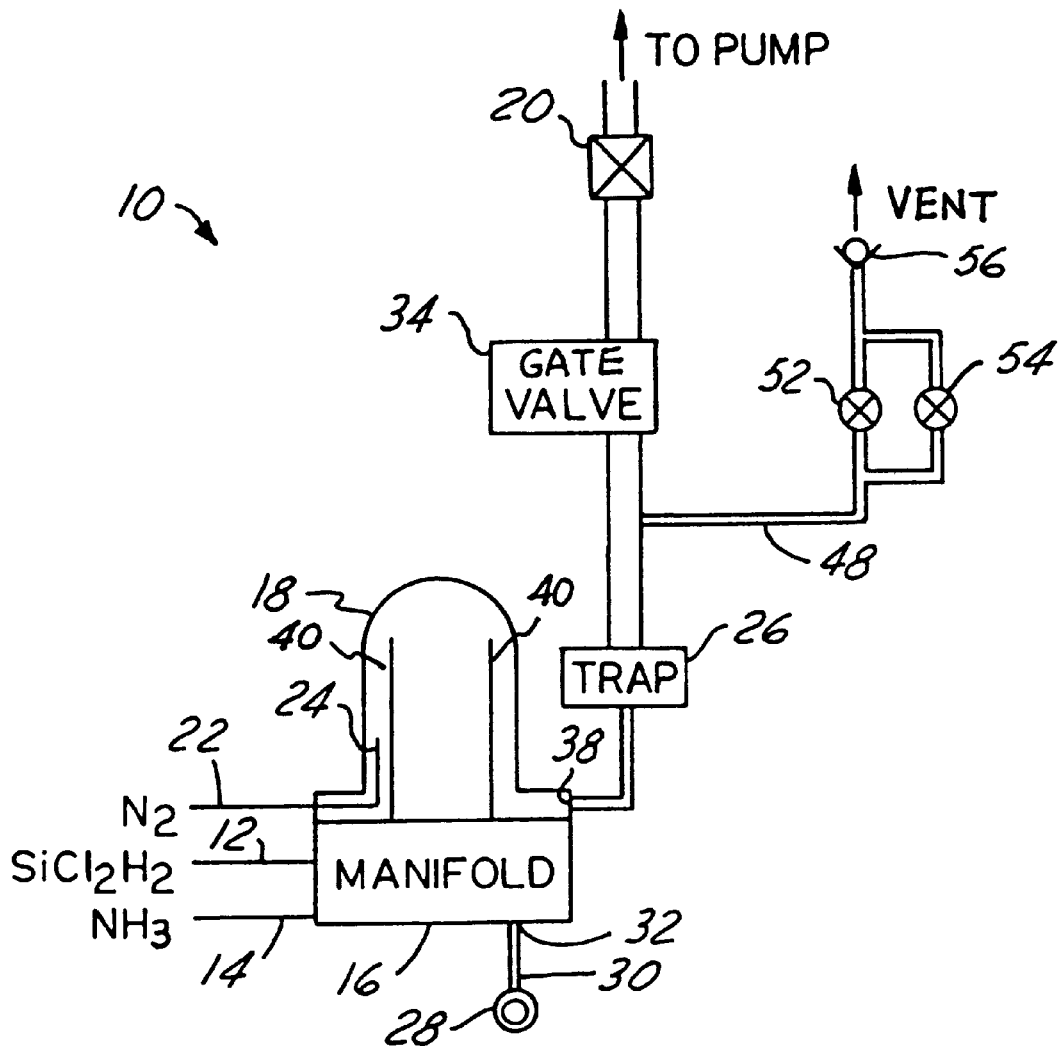
FIG. 1 is a diagram illustrating the configuration of a conventional semiconductor process chamber for the low pressure chemical vapor deposition of silicon nitride films.

The present invention discloses an apparatus and a method for preventing contamination to a low pressure chemical vapor deposition chamber such as those used in depositing nitride films or TEOS oxide films. The apparatus incorporates the use of an exhaust-vent device which is connected to a vent outlet and an evacuation means of a LPCVD chamber in parallel with and bypassing a gate valve. The exhaust-vent device includes a first conduit and a second conduit on the two extreme ends connected in fluid communication with a middle conduit thereinbetween. The first conduit and the second conduit each has an internal diameter that is at least two times the internal diameter of the middle conduit. The device is further equipped with a pneumatic valve positioned in the middle conduit for turning on or off the exhaust-vent device.

While the present invention apparatus and method may be used in any semiconductor processes, they are particularly suited for use in a low pressure chemical vapor deposition (LPCVD) process. For instance, a LPCVD process that is frequently used in depositing silicon nitride films and TEOS oxide films. The processes for depositing nitride films and TEOS oxide films are known to produce particle contamination problems. A particle contamination problem occurring in the nitride film deposition process is also known as nitride haze effect. The nitride haze effect may result in the rework or scrap of a complete wafer. By practicing on the present invention method, TEOS oxide particle counts can be reduced from over 1,000 to below 50 on each wafer. The present invention novel method therefore further stretches out the preventive maintenance period.

The present invention novel apparatus and method not only solves the problem of the occurrence of a laminar flow that brings reaction by-products back into a reaction chamber and causing contamination, but also resolves the problem of the occurrence of a blockage in the vacuum conduit by contaminating particles.

The present invention novel method solves the particle contamination problem in two ways. First, an exhaust-vent device is added to the process chamber such that an evacuation of the chamber interior can be continued during boat-in/out (or wafer loading/unloading) processes for preventing the back-flow of the contaminating particles. Secondly, the present invention novel apparatus provides an exhaust-vent device that is constructed by two outer conduits of larger diameter connected by a middle conduit of smaller diameter. Based on a laminar flow principal, at the same volume of fluid flow, the velocity of the flow is inversely proportional to the cross-sectional area of the conduit. The fluid flow speed in the middle narrow tube is therefore increased to prevent any blockage of the middle tube by contaminating particles.

The present invention novel apparatus may further be enhanced by installing heating elements onto the vacuum conduits and heating the conduits to a temperature between about 100° C. and about 180° C. such that any deposition of reaction by-products on the inner walls of the conduits can be prevented. This further reduces the chance of contaminating particles feedback occurring during a back-flow process.

The present invention novel apparatus of an exhaust-vent device can be easily installed onto a process chamber after a preventive maintenance procedure. When a straight tube of small diameter is used, the tube is easily blocked by particles such as ammonium chloride generated in a LPCVD nitride process. When a straight tube exhaust-vent device is used and is blocked by the contaminating particles, the blockage frequently causes a nitride haze defect on the wafer that is being processed in the CVD chamber. This leads to a low yield for the wafer fabrication process when the wafer may be reworked or scrapped. The small tube used in the exhaust vent is difficult to clean during a preventive maintenance procedure.

The present invention novel apparatus utilizes a horn-shaped exhaust vent in which two large conduits are connected by a smaller conduit in the middle. Based on a laminar flow principal, when the volume of the fluid flow is kept constant, the flow speed through a conduit is inversely proportional to the cross-sectional area of the conduit. For instance, when the large conduit has a diameter that is four times that of the small conduit, the velocity of the fluid flow through the small conduit may be sixteen times the velocity of the fluid flowing through the large conduit.

Figure 2:
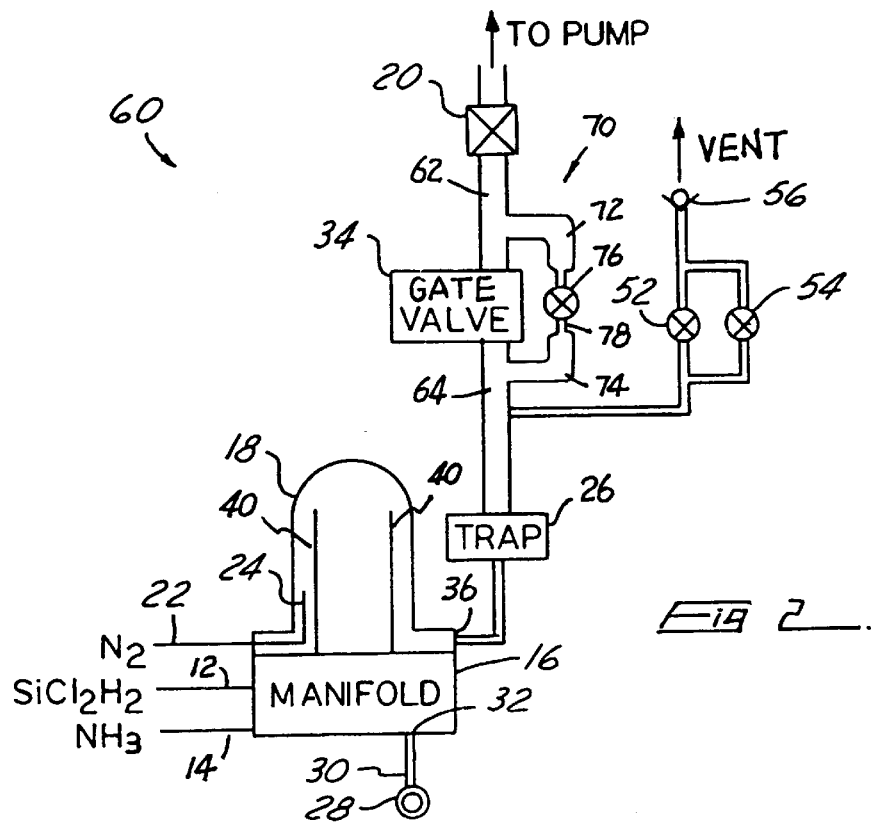
FIG. 2 is a diagram illustrating the configuration of the present invention process chamber for the chemical vapor deposition of silicon nitride films exemplified in the preferred embodiment.

The present invention apparatus 60 is shown in FIG. 2 which incorporates the use of a present invention exhaust-vent device 70. The exhaust-vent device 70 is mounted in parallel to and bypassing the gate valve 34. The exhaust-vent device 70 is constructed by a first conduit 72, a second conduit 74, a middle conduit 78 and a pneumatic valve 76 installed in the middle conduit 78. The end of the first conduit 72 is connected to the vacuum conduit 62, while the end of the second conduit 74 is connected to the vacuum conduit 64. The vacuum conduit 62 is in turn connected to the vacuum pump (not shown) through an automatic pressure controller 20. The vacuum conduit 64 is in turn connected to the process chamber 18 through a cold trap 26.

Figure 3:
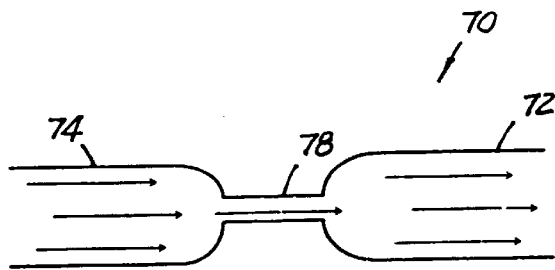
FIG. 3 is a diagram illustrating an exhaust-vent device wherein the outside conduits are four times the size of the inside conduit.
Figure 4:
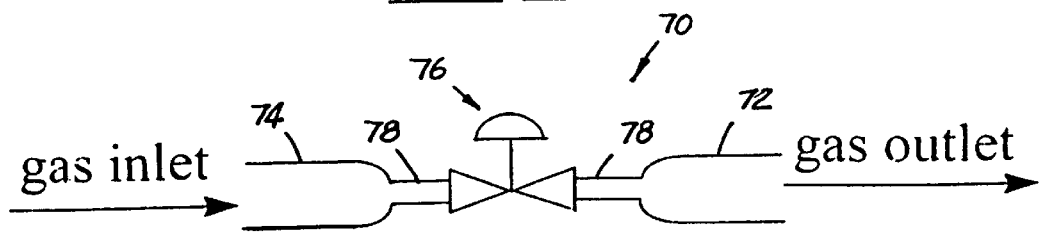
FIG. 4 is a diagram illustrating an exhaust-vent device incorporating a pneumatic valve in the middle conduit.

An enlarged, cross-sectional view of the present invention exhaust-vent device 70 without the pneumatic valve 76 is shown in FIG. 3. An enlarged, cross-sectional view of the present invention exhaust-vent device 70 with a pneumatic valve 76 installed is shown in FIG. 4. As shown in FIG. 3, based on a laminar flow theory, the flow velocity of the fluid inside the conduit 72, 74 and 78 is inversely proportional to the cross-sectional area of the conduit. For instance, when the diameter of the two end conduits 72, 74 is 25.4 mm (1 in), while the internal diameter of the middle conduit 78 is 6.35 mm (¼in), the flow velocity in the middle conduit 78 is 16 times that of the flow velocity in the large conduits 72, 74. The high flow velocity in the middle conduit 78 therefore prevents any possible cumulation of contaminating particles on the interior walls of the conduit. Any potential blockage of the conduit by a reaction product of ammonium chloride in a nitride process can be prevented.

As shown in FIG. 4, the pneumatic valve 76 which is a normal-closed air actuated valve is also purged by the high velocity flow through the small conduit 78. This prevents the interior passageway in the pneumatic valve 76 from being blocked by the reaction by-product.

The present invention apparatus of exhaust-vent device 70 is opened when the gate valve 34 is closed during a wafer loading and unloading process with a vacuum pump operating. This prevents any contaminating by-products in the vacuum conduit from being back-flowed into the process chamber 18 so that chances for the contamination of wafers can be completely eliminated.

As shown in FIG. 2, the present invention method for preventing contamination to a LPCVD chamber 18 can be carried out by first providing a chamber 18 which is equipped with a vent outlet 36 in fluid communication with a gate valve 34 and a vacuum pump (not shown). An exhaust-vent device 70 is then connected in parallel with and bypassing the gate valve 34. The device 70 is constructed by a first conduit 74 connected to the vent outlet 36, a second conduit 72 connected to the vacuum pump, and a middle conduit 78 which provides fluid communication between the first and second conduits. The middle conduit may be equipped with a pneumatic valve 76. The pneumatic valve 76 is then turned on with the vacuum pump operating while at least one wafer is loaded into the deposition chamber 18. A deposition process on the at least one wafer is then conducted. The at least one wafer is then unloaded from the deposition chamber 18 with the pneumatic valve 76 on and the evacuation means operating. The continuous evacuation of the vacuum conduits during the wafer loading and unloading process prevents any back-flow of contaminating particles that may have deposited on the interior walls of the vacuum conduit.

In an alternate embodiment, the vacuum conduits 62, 64, 72 and 74 may be heated by a heating tape that is wrapped around the conduit. The conduits may be heated to a temperature between about 100° C. and about 180° C. such that the probability of particulate deposits on the interior walls of the vacuum conduits can be further reduced.

The present invention novel apparatus and method have therefore been amply demonstrated in the above descriptions and in the appended drawings of FIGS. 2, 3 and 4. It should be noted that while the process of a low pressure chemical vapor deposition for nitride and TEOS oxide is illustrated, the present invention novel method and apparatus can be advantageously used in other low pressure processing methods that requires the evacuation of a vacuum chamber and the prevention of any back-flow of contaminating particles back into the chamber.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. An apparatus for preventing contamination in a low pressure chemical vapor deposition chamber comprising:
    a chamber equipped with a vent outlet in fluid communication with a gate valve and an evacuation means, and
    an exhaust-vent device connected to said vent outlet and said evacuation means in parallel with and bypassing said gate valve which includes a first conduit and a second conduit connected in fluid communication with a middle conduit therein between,
    said first conduit and said second conduit each having an internal diameter at least two times the internal diameter of said middle conduit, and a pneumatic valve positioned in said middle conduit adapted for turning on or off said exhaust-vent device.

2. An apparatus for preventing contamination in a low pressure chemical vapor deposition chamber according to claim 1, wherein said chamber further comprises a cold trap and an automatic pressure controller connected in series and in fluid communication with said gate valve.

3. An apparatus for preventing contamination in a low pressure chemical vapor deposition chamber according to claim 1, wherein said pneumatic valve is turned on during wafer loading and unloading processes into and out of said deposition chamber with said evacuation means in operation.

4. An apparatus for preventing contamination in a low pressure chemical vapor deposition chamber according to claim 1, wherein said evacuation means is a vacuum pump.

5. An apparatus for preventing contamination in a low pressure chemical vapor deposition chamber according to claim 1, wherein said first conduit and said second conduit each having an internal diameter four times the internal diameter of said middle conduit.

6. An apparatus for preventing contamination in a low pressure chemical vapor deposition chamber according to claim 1, wherein said pneumatic valve is a normal-closed air actuated valve.

7. An apparatus for preventing contamination in a low pressure chemical vapor deposition chamber according to claim 1, wherein said first conduit and said second conduit each having an internal diameter of about 25.4 mm and said middle conduit having an internal diameter of about 6.35 mm.

8. An apparatus for preventing contamination in a low pressure chemical vapor deposition chamber according to claim 1, wherein said low pressure chemical vapor deposition chamber is a silicon nitride deposition chamber.

9. An apparatus for preventing contamination in a low pressure chemical vapor deposition chamber according to claim 1, wherein said exhaust-vent device is turned on during wafer loading and unloading such that reaction by-products produced in said deposition chamber is carried away by said evacuation means.

10. An apparatus for preventing contamination in a low pressure chemical vapor deposition chamber according to claim 1, wherein said deposition chamber is a silicon nitride deposition chamber which generates a reaction by-product of $NH_4Cl$.

11. An apparatus for preventing contamination in a low pressure chemical vapor deposition chamber according to claim 1, wherein said deposition chamber is a TEOS deposition chamber.

12. An apparatus for preventing contamination in a low pressure chemical vapor deposition chamber comprising:
    a chamber equipped with a vent outlet in fluid communication with a gate valve and an evacuation means, and
    an exhaust-vent device connected to said vent outlet and said evacuation means in parallel with and bypassing said gate valve which includes a first conduit and a second conduit connected in fluid communication with a middle conduit therein between, said first conduit and said second conduit each having an internal diameter at least two times the internal diameter of said middle conduit, a fluid flow rate in said middle conduit when said evacuation means is operating is at least 4 times the fluid flow rate in said first and second conduit and a pneumatic valve positioned in said middle conduit adapted for turning on or off said exhaust-vent device.

13. An apparatus for preventing contamination in a low pressure chemical vapor deposition chamber according to claim 1, wherein a fluid flow rate in said middle conduit is sufficiently higher than a fluid flow rate in said first and second conduit such that reaction by-products from said chamber does not cumulate in said middle conduit.

14. An apparatus for preventing contamination in a low pressure chemical vapor deposition chamber according to claim 1, wherein a fluid flow rate in said middle conduit is sufficiently high such that reaction by-product from said deposition chamber does not cumulate in said pneumatic valve.

15. An apparatus for preventing contamination in a low pressure chemical vapor deposition chamber according to claim 1, wherein said exhaust-vent device operates to prevent any reaction by-product deposited in said first, second and middle conduit from being back-flowed into said deposition chamber.

16. An apparatus for preventing contamination in a low pressure chemical vapor deposition chamber according to claim 12, wherein said chamber further comprises a cold trap and an automatic pressure controller connected in series and in fluid communication with said gate valve.

17. An apparatus for preventing contamination in a low pressure chemical vapor deposition chamber according to claim 12, wherein said pneumatic valve is turned on during wafer loading and unloading processes into and out of said deposition chamber with said evacuation means in operation.

18. An apparatus for preventing contamination in a low pressure chemical vapor deposition chamber according to claim 12, wherein said evacuation means is a vacuum pump.

19. An apparatus for preventing contamination in a low pressure chemical vapor deposition chamber according to claim 12, wherein said first conduit and said second conduit each having an internal diameter four times the internal diameter of said middle conduit.

20. An apparatus for preventing contamination in a low pressure chemical vapor deposition chamber according to claim 12, wherein said pneumatic valve is a normal-closed air actuated valve.

* * * * *